United States Patent [19]

Martin

[11] 3,904,934

[45] Sept. 9, 1975

[54] INTERCONNECTION OF PLANAR ELECTRONIC STRUCTURES

[75] Inventor: Jacob H. Martin, Wellesley, Mass.

[73] Assignee: Massachusetts Institute of Technology, Cambridge, Mass.

[22] Filed: Mar. 26, 1973

[21] Appl. No.: 344,846

[52] U.S. Cl. .............................. 317/101 D; 339/17

[51] Int. Cl. .......................... H02b 1/02; H05k 1/04

[58] Field of Search .. 317/101 CC, 101 CM, 101 D, 317/101 DH; 339/17 L, 17 LM, 176 MP, 17 LC

[56] References Cited

UNITED STATES PATENTS

| | | | |
|---|---|---|---|
| 3,290,756 | 12/1966 | Dreyer | 317/101 CM |
| 3,356,786 | 12/1967 | Helms | 174/68.5 |
| 3,529,213 | 9/1970 | Farrand et al. | 317/101 D |
| 3,636,499 | 1/1972 | Winklebleck | 339/75 MP |

OTHER PUBLICATIONS

Bresg, "Spring Contactor," IBM Tech. Disc. Bull., Vol. 10, No. 4, Sept. 1967, p. 363.

*Primary Examiner*—David Smith, Jr.
*Attorney, Agent, or Firm*—Arthur A. Smith, Jr.; Martin M. Santa; Joseph S. Iandiorio

[57] ABSTRACT

An interconnection system for interconnecting a plurality of planar electronic circuit boards each of the circuit boards including a plurality of contact portions for providing electrical coupling, the system including a support sheet disposed between each pair of planar electronic circuit boards; a plurality of coupling elements disposed in each support sheet, electrically insulated from the other coupling elements on that support sheet, and aligned with the contact portions on the adjacent planar electronic circuit boards for providing electrical, mechanical and thermal coupling between the planar electronic circuit boards, each of the coupling elements having two ends, one end extending beyond the support sheet on each side, each end having a small cross-sectional area for increasing the contact pressure between it and a corresponding contact portion to provide a tight connection between the contact portion and a coupling element.

4 Claims, 10 Drawing Figures

INTERCONNECTION OF PLANAR ELECTRONIC STRUCTURES

This invention was sponsored by NASA under Contract No. NAS 9-4065.

FIELD OF INVENTION

This invention relates to electronic packaging and, more particularly, packaging techniques using the same members to provide electrical, mechanical and thermal interconnection of electronic circuits on planar circuit boards.

BACKGROUND OF INVENTION

Electronic packaging generally consists of providing for electrical interconnections, thermal control and mechanical integrity in electronic systems. Electronic packaging is usually done through a superposition process. First, wiring is provided for the necessary electrical connections. Second, structure is added to hold the elements together and third, thermal control is provided where necessary. This approach provides rugged and reliable electronic system, but is becoming less practical today. This is so because when dealing with present day microelectronic systems, especially those utilizing integrated circuits the interconnections comprise the majority of the volume required for the system. Consequently, an integrated approach to packaging is now desirable. An early method of integrated electronic packaging involved stacking planar circuits alternately with interconnection wafers including conductive members that projected from the wafers and were aligned with contacts on the planar circuit boards. See "Batch-Fabricated Three-Dimensional Planar Coaxial Interconnections for Micro-electronic systems", published in the IEEE Transactions on Computers, Vol. c-20, No. 5, May 1971. Coupling among the conductive members on each wafer was provided for properly interconnecting the circuits. The entire stack was then clamped to insure contact between the conductive members and the planar circuit boards and provide structural integrity in the system. With such a system the size and weight of the permanent clamping apparatus could substantially reduce the benefits otherwise provided, and great force is required to maintain proper contact between the conductive members and contacts. Furthermore, if the clamping apparatus is inadvertantly disturbed, there arises the possibility that contact may be lost between the conductive members and contacts.

SUMMARY OF INVENTION

It is, therefore, an object of this invention to provide a technique for interconnecting planar structures that minimizes the weight and volume of the interconnections by utilizing the electrical connectors as structural and thermal members.

It is a further object that the electrical connections be initially demountable but quickly and easily convertible to permanent connections.

It is a further object of this invention to provide a technique for interconnecting planar structures that provides maximum electrical contact pressure with minimum force.

This invention features an interconnection system for interconnecting a plurality of planar electronic circuit boards, each of the circuit boards including a plurality of contact portions for providing electrical coupling. The system includes a support sheet disposed between each pair of the planar electronic circuit boards and a plurality of coupling elements disposed in each support sheet. The coupling elements on each support sheet are electrically insulated from the other coupling elements on that support sheet and are aligned with the contact portions on the adjacent planar electronic circuit boards for providing electrical, mechanical and thermal coupling between the planar electronic circuit boards. Each of the coupling elements has two ends, one end extending beyond the support sheet on each side. Each end has a small cross-sectional area for increasing the contact pressure between it and the corresponding contact portion to provide a tight connection between the contact portion and the coupling element.

DESCRIPTION OF PREFERRED EMBODIMENT

Other objects, features and advantages will occur from the following description of the preferred embodiments and the accompanying drawings wherein.

Figure 1:
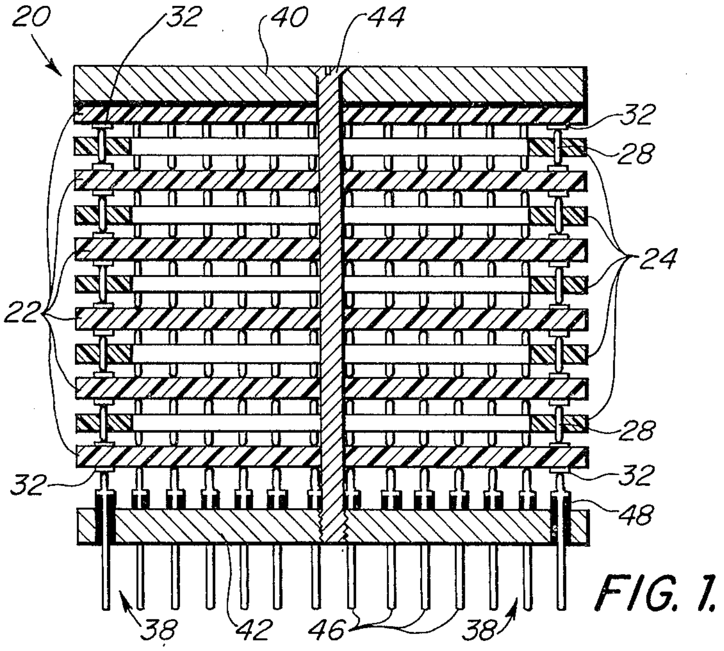
FIG. 1 is a sectional elevation view of an electronic apparatus including a plurality of planar circuit boards interconnected in accordance with the subject invention.
Figure 2:
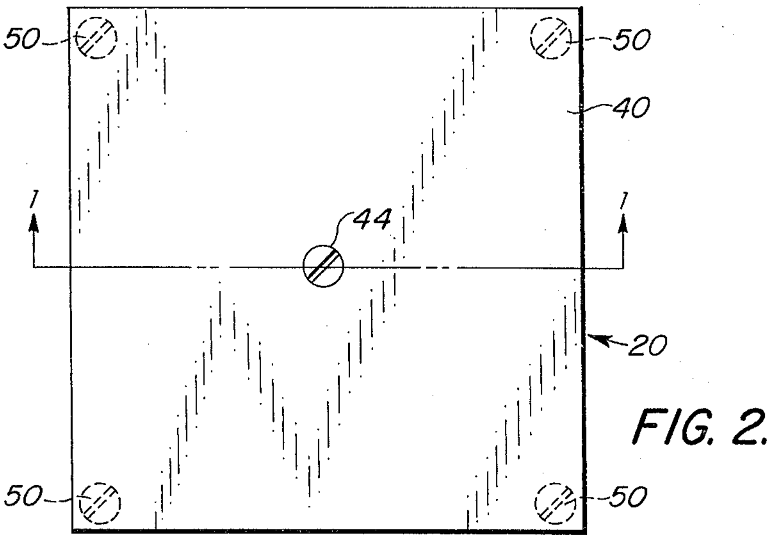
FIG. 2 is a plan view of the apparatus depicted in FIG. 1.

There is shown, in FIGS. 1 and 2, an electronic assembly 20 including a plurality of parallel planar electronic circuit boards 22 separated by at least one of a plurality of parallel coupling supports 24.

Figures 3, 5:
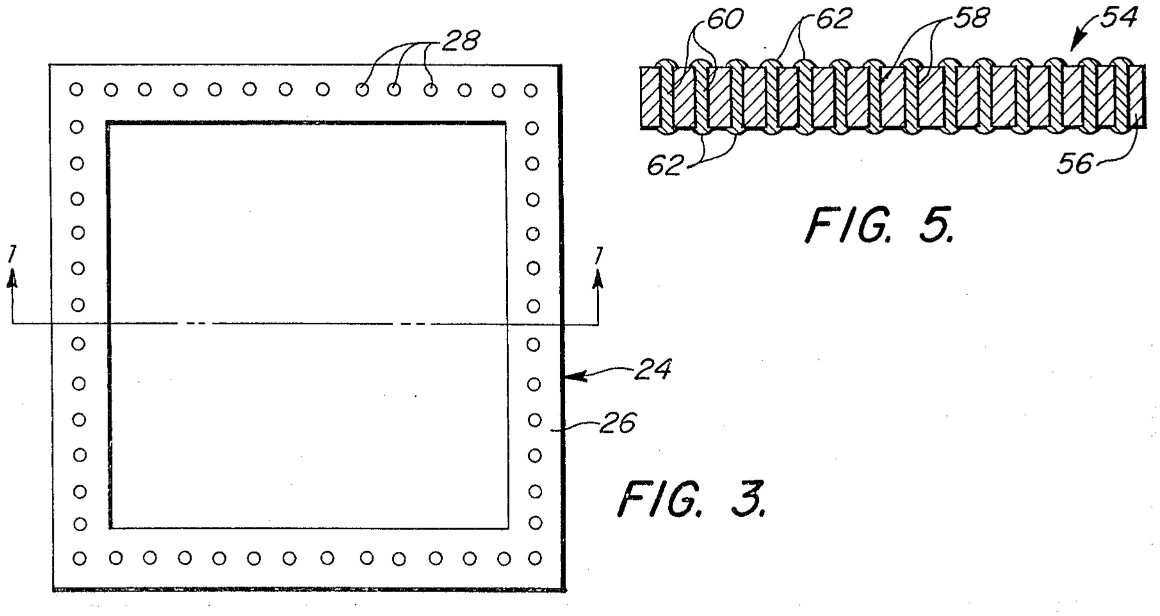
FIG. 3 is a plan view of one of the coupling supports utilized in the apparatus shown in FIG. 1.
FIG. 5 shows an alternate coupling element embodiment.

There is shown a plan view of each coupling support 24, FIG. 3, including a square support portion 26 that is non-conductive of electricity. Support portion 26 includes openings that are in a preselected pattern and retain coupling elements, pins 28, to be described more fully below. Support portion 26 is shown to be a square with the central portion removed and the pins 28, similarly arranged in the outline of a square, but this is not a limitation of the invention as any shape is suitable which is compatible with the circuit boards.

Figure 4:
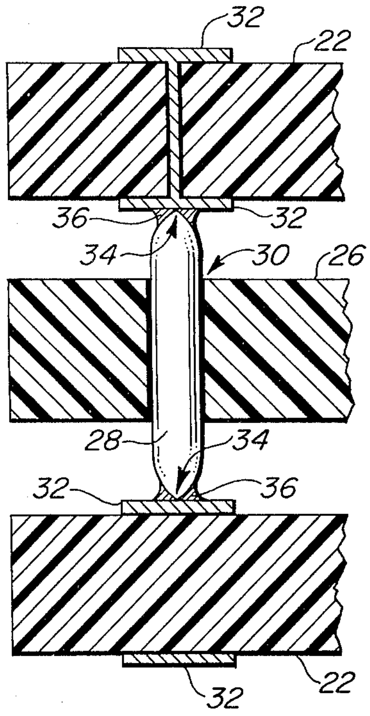
FIG. 4 is a sectional detail view of one of the coupling elements utilized in the apparatus depicted in FIGS. 1 and 3.

Each coupling element, pin 28, is disposed in an opening 30, FIG. 4, in support 26; opening 30 is sized so that pin 28 can be moved therein. Portions of planar circuit boards 22 above and below pin 28 are shown. In each of planar circuit boards 22 are contact portions 32 that interact with tapered end portions 34 of pin 28. Only the contact portions associated with pins 28 of the sides of assembly 20 have been shown: contacts 32 associated with other internal pins 28 are omitted for clarity. Tapered end portions 34 fulfill two functions.

First, when vertical clamping pressure is applied to assembly 20, as will be described below, tapered end portions 34 plastically deform to reduce the effective length of pin 28. Thus, the length of each pin 28, FIGS. 1 and 3, is reduced as necessary: deviation from a strict parallel planar relationship among supports 24 and planar circuit boards 22 is compensated for as apparatus 20 is compressed. Opening 30 further promotes this compensation by permitting pin 28 to slide therein as needed. Second, the small contact area provided between tapered points 34 and contact portions 32 is subjected to a substantial force. Thus, at each tapered point 34 the contact pressure can be increased to a level at which a hermetic seal is provided, so that gas cannot penetrate the seal and cause corrosion.

In one preferred bonding system, FIG. 4, tapered ends 34 are coated with fusible electrically conductive bonding material 36. Application of heat causes condition responsive material 36 to fuse. The bonding material 36 can be tin-lead solder, so that upon the application of heat, bonding material 36 fuses and permanently bonds pin 28 to contact portions 32. Contact portions 32 may be aligned on either side of the respective boards and they may either be electrically interconnected as indicated at the top of FIG. 4 or isolated as indicated at the bottom of FIG. 4. Or, the pin 28 can be plated with indium and utilized in conjunction with indium contact portions 32. The indium-indium interface forms a bond under heat and pressure, in the same manner as the tin-lead solder bonding system. Other bonding systems that can be utilized include providing a pin 28 composed of gold for use with gold contact portions 32. Under pressure and heat, the gold-gold junction forms a thermocompression bond. Thermocompression bonding is accomplished by applying pressure with heat to the parts to be bonded. Other types of bonding such as brazing and eutectic bonding may also be used. Localized bonding could be accomplished using focussed infra-red or laser heating.

Referring again to FIG. 1 it is seen that contact portions 32 alternate with pins 28 in the dimension. Upon bonding, each column of pins and the attendant supports form a plurality of substantially linear couplers 38 that are perpendicular to, and couple circuit boards 22 electrically, mechanically and thermally. Best thermal dissipation is provided if circuit boards 22 comprise a thermally conductive substance such as alumina or beryllia.

An upper clamping pressure plate 40, a lower clamping pressure plate 42 and a clamp screw 44 supply clamping pressure to assembly 20. This clamping pressure may be used to cause the deformation of tapered ends 34 or other external clamping means may be used. The clamping force, from whatever source, supplies mechanical integrity to assembly 20 prior to bonding.

The lower end of each linear coupler 38 terminates in pin 46 that is insulated from lower clamp pressure plate 42 by a cylindrical insulator 48. Electrical connections to the assembly 20 are made to the pins 46. Although, only one clamp screw 44 is shown, FIG. 1, additional clamp screws can be utilized. For example, a clamp screw 50, shown in phantom, may be located at each corner of upper clamp pressure plate 40 in FIG. 2. When fabricating larger assemblies 20 additional clamp screws 44 or 50 are helpful to compensate for any possible flexing of clamp pressure plates 40 and 42.

During fabrication of assembly 20, the circuit boards 22 and the supports 24 are alternately stacked on lower clamp pressure plate 42. It will be noted that this is a zero insertion force system. More than one support 24 can be placed between any two circuit boards 22 if a greater spacing therebetween is desired. Finally, upper clamp pressure plate 40 is situated, the assembly is aligned and clamp screw 44 is put in place and tightened. Electrical testing of assembly 20 follows. Electrical repairs are made by removing the clamping apparatus and disassembling assembly 20. When it is determined that assembly 20 functions properly, permanent bonding is effected to form the assembly into a unitary structure. When bonding is complete, clamp pressure plate 40 and clamping screw 44 can be removed or they can be left in place if it is desired to provide physical protection or additional heat sinking ability. Basic heat sinking is provided as thermal energy is conducted by circuit boards 22 to linear couplers 38 and thence to clamp pressure plates 40 and 42. Thus, a system is provided whereby an electronic assembly 20 is fabricated utilizing commmon elements for electrical, mechanical and thermal interconnections at a considerable space and weight saving as compared to prior art. Additionally, bonding material 36 permits assembly 20 to become a unitary structure that will not be destroyed by accidental removal of clamp screw 44.

Figure 6:
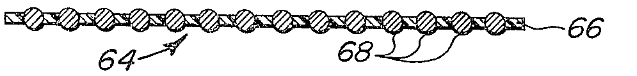
FIG. 6 shows still another coupling element embodiment.

Alternatively, FIG. 5, although only one type of coupling element, i.e., pins 28 have been illustrated in FIGS. 1–4, the invention is not limited to a particular type of pin. For example, FIG. 5, coupling support 54 including an electrically non-conductive support portion 56 having a plurality of openings 58, may have coupling elements comprised of rivets 60 in openings 58. Hemispheric heads 62 on each end of each rivet 60 provide the increased contact pressure and length compensation described with respect to tapered ends 34, FIG. 4. Bonding between rivets 60 and contacts can be done by any of the methods described previously. Another coupling support 64, FIG. 6, includes an insulating support portion 66 retaining a plurality of coupling elements in the form of spheres 68. Any of the previously described bonding systems can be utilized with support 64.

Figure 7:
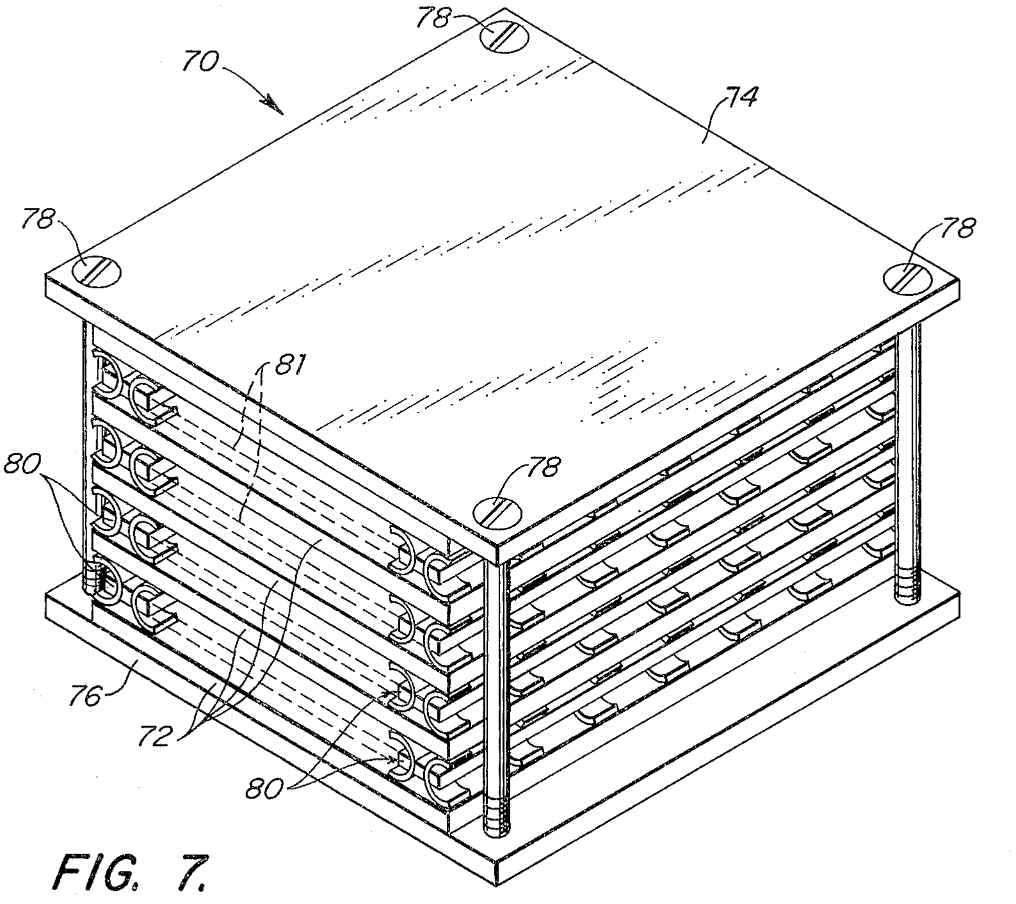
FIG. 7 is an axonometric view of another electronic apparatus comprising a plurality of planar electronic circuit boards.
Figure 8:
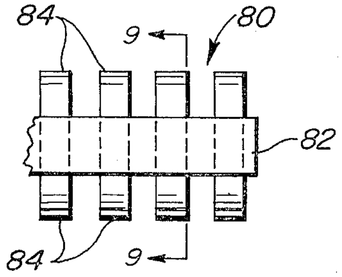
FIGS. 8 and 9 are detailed views of the coupler element utilized in the apparatus shown in FIG. 7.
Figure 9:
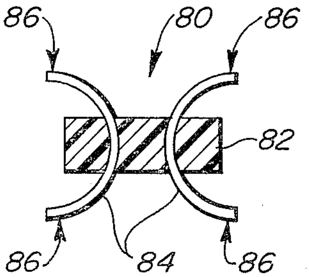
Figure 10:
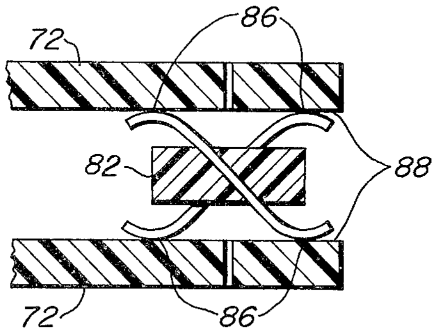
FIG. 10 is a sectional detail view of another type of coupler element which can be used in the apparatus shown in FIG. 7.

An alternative electronic assembly 70, FIG. 7, includes a plurality of planar electronic circuit boards 72 between an upper clamp pressure plate 74 and a lower clamp pressure plate 76; four clamp screws 78 extend between plates 74 and 76. Rows of contact portions extend along opposing edges of planar circuit boards 72 in contact with coupling supports 80, FIGS. 8 and 9. In each coupling support 80 an insulating support portion 82 supports a plurality of coupling elements, leaf springs, 84. As shown most clearly in FIG. 9, the springs 84 are mounted in pairs and extend through support portion 82. A wiping surface 86 is coated with solder, or, the gold-gold or indium-indium interface described previously can be utilized as the bonding system for this embodiment. For clarity, additional springs 84 have not been shown in place on member 81 of coupling support 80, but may be located there as well according to this invention. On the ends of circuit boards 72, FIG. 10, are contact portions 88, between which are coupling supports 80. The outer ends of the wiping surfaces 86 first come in contact with contacts 88, and as clamp screws 78 are tightened and contact portions 88 come closer together, wiping surfaces 86 scrape across contact portions 88 so that interior portions of wiping surfaces 86 are in contact. This wiping motion helps insure a good electrical contact. Contacts 88 on opposite sides of circuit boards 72 may be electrically connected or isolated as discussed, supra, with reference to FIG. 4.

Assembly 70 is constructed by alternately stacking planar circuit boards 72 and coupling supports 80 on lower clamp pressure plate 76. Finally, upper clamp pressure plate 74 is put in place and clamp screws 78 are inserted and tightened. Any deviation from a parallel planar relationship among planar circuit boards 72 is compensated for by varying degrees of flexure in springs 84. Electrical testing is performed and, if assembly 70 functions properly, bonding can be provided to form a unitary structure.

Modifications and variations of the present invention are possible in view of the above teachings. For example, the bonding material 36 depicted in FIG. 4 can be coated on contact portions 32 instead of, or in addition to, tapered end portions 34. Or, if the central portion of support portion 26 is not removed, pins 28 can be placed therein and the contact portions 32 can be disposed in any area of the surface of circuit board 22. It is to be understood, therefore, that the invention can be practiced otherwise than as specifically described.

Other embodiments will occur to those skilled in the art and are within the following claims:

What is claimed is:

1. An interconnection system for interconnecting a plurality of planar electronic circuit boards, each of the circuit boards including plurality of discrete contact portions for providing electrical coupling, said system comprising:

a support sheet disposed between and spaced from each pair of said planar electronic circuit boards;

a plurality of coupling elements slidably disposed in holes in each said support sheet and electrically insulated from the other said coupling elements on that support sheet, and aligned with said contact portions on the adjacent planar electronic circuit boards for providing direct electrical, mechanical and thermal coupling between said planar electronic circuit boards, each of said coupling elements having two ends extending substantially beyond said support sheet on opposite sides, each said end having a small cross-sectional area for increasing the contact pressure between it and a corresponding contact portion to provide a tight connection between said contact portion and said coupling element, and each of said coupling elements being sized to snugly fit and to move axially in said holes to independently adjust for deviations in said boards and sheets.

2. An interconnection system for interconnecting a plurality of planar electronic circuit boards, each of the circuit boards including a plurality of discrete contact portions for providing electrical coupling, said system comprising:

a support sheet disposed between and spaced from each pair of said planar electronic circuit boards;

a plurality of coupling elements disposed in each said support sheet electrically insulated from the other said contact portions on the adjacent planar electronic circuit boards for providing direct electrical, mechanical and thermal coupling between said planar electronic circuit boards; each of said coupling elements including a pair of resilient members each member including a first curved section extending from one side of said sheet, a second curved section extending from the other side of said sheet, and a third section interconnecting the first and second sections and passing through said sheet, said paired members being arranged to confront each other with their generally convexly curved contours.

3. The system according to claim 1 wherein said coupling elements are spherical.

4. An interconnection system for interconnecting a plurality of planar electronic circuit boards, each of the circuit boards including a plurality of discrete contact portions for providing electrical coupling, said system comprising:

a support sheet disposed between and spaced from each pair of said planar electronic circuit boards;

a plurality of coupling elements slidably disposed in holes in each said support sheet and electrically insulated from the other said coupling elements on that support sheet, and aligned with said contact portions on the adjacent planar electronic circuit boards for providing direct electrical, mechanical and thermal coupling between said planar electronic circuit boards, each of said coupling elements having two ends extending substantially beyond said support sheet on opposite sides, each said end having a small cross-sectional area for increasing the contact pressure between it and a corresponding contact portion to provide a tight connection between said contact portion and said coupling element and each of said coupling elements being sized to snugly fit and to move axially in said holes to independently adjust for deviations in said boards and sheets; and clamping means for clamping together said coupling elements and the contact portions.

* * * * *